United States Patent

Mesuda et al.

[11] Patent Number: 5,598,130
[45] Date of Patent: Jan. 28, 1997

[54] PHASE MODULATOR CAPABLE OF INDIVIDUALLY DEFINING MODULATION DEGREE AND MODULATION FREQUENCY

[75] Inventors: Etsuji Mesuda; Osamu Tagiri, both of Atsugi, Japan

[73] Assignee: Anritsu Corporation, Tokyo, Japan

[21] Appl. No.: 539,439

[22] Filed: Oct. 5, 1995

[30] Foreign Application Priority Data

Oct. 20, 1994 [JP] Japan .................................. 6-255435

[51] Int. Cl.$^6$ .............................. H03C 3/00; H03B 29/00
[52] U.S. Cl. .......................... 332/119; 332/144; 331/39; 331/78
[58] Field of Search ...................................... 332/144, 146, 332/119; 455/42, 102, 110, 111, 226.1; 375/226; 331/39, 78

[56] References Cited

U.S. PATENT DOCUMENTS

| | | | |
|---|---|---|---|
| 3,706,946 | 12/1972 | Bickford et al. | 332/183 |
| 4,810,977 | 3/1989 | Flugstad et al. | 332/19 |
| 4,916,411 | 4/1990 | Lymer | 331/25 |

FOREIGN PATENT DOCUMENTS 2621191  3/1989  France .

Primary Examiner—Siegfried H. Grimm
Attorney, Agent, or Firm—Frishauf, Holtz, Goodman, Langer & Chick

[57] ABSTRACT

An FM signal generator generates an FM signal obtained by frequency-modulating a reference frequency signal with a modulating frequency signal. A first mixer mixes the FM signal and an input signal having a predetermined carrier frequency and outputs a pair of frequency signals having sum and difference frequencies thereof. A first signal extracting unit extracts one of the pair of frequency signals as an intermediate frequency signal. A delay circuit delays the extracted intermediate frequency signal by a predetermined time. A second mixer mixes the delayed intermediate frequency signal and the FM signal and outputs a pair of frequency signals having sum and difference frequencies. A second signal extracting unit extracts the frequency signal of the pair of frequency signals which corresponds to the carrier frequency component as a phase-modulated signal. The modulation degree and modulation frequency in phase modulation for the phase-modulated signal can be set in wide ranges.

14 Claims, 3 Drawing Sheets

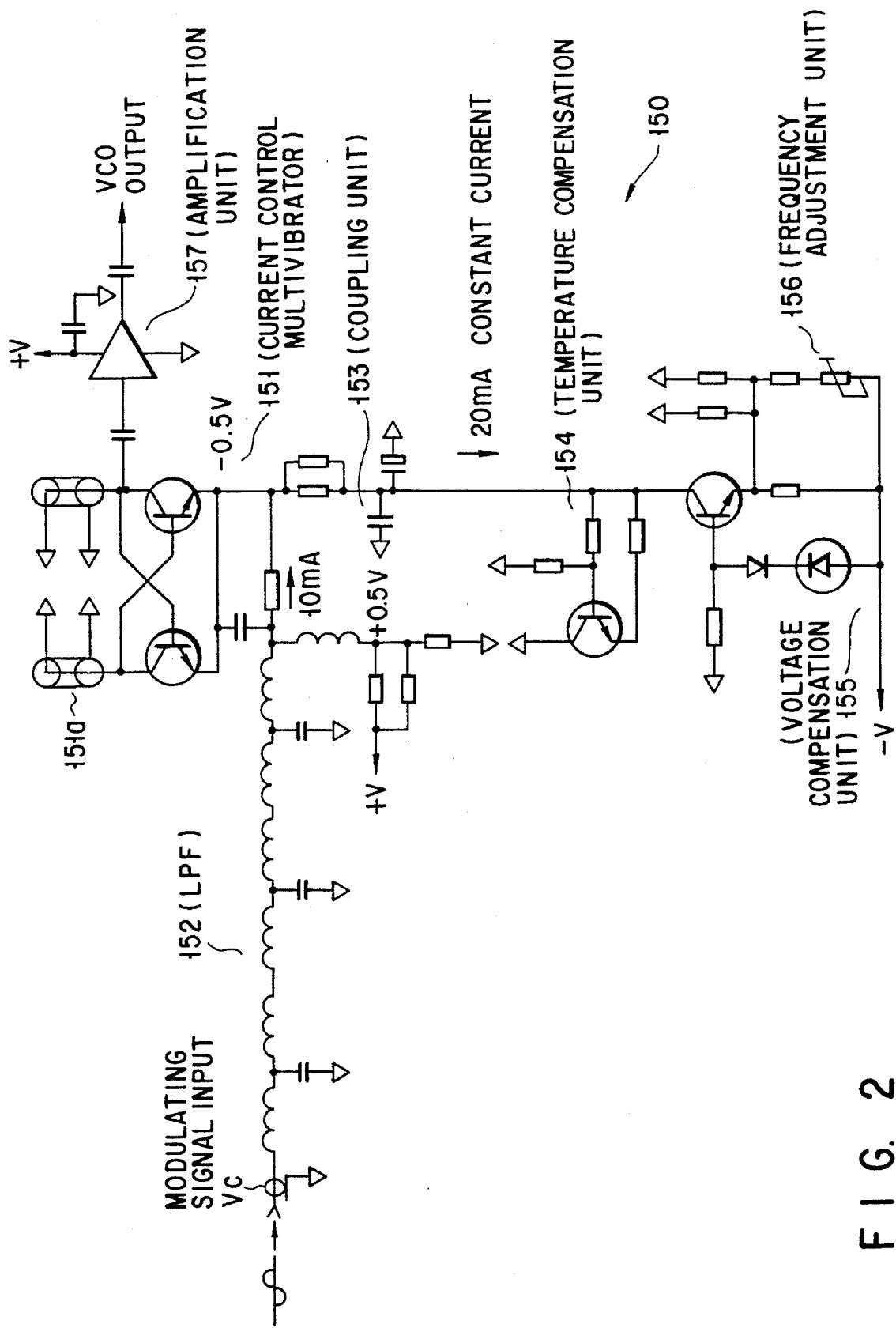
F I G. 2

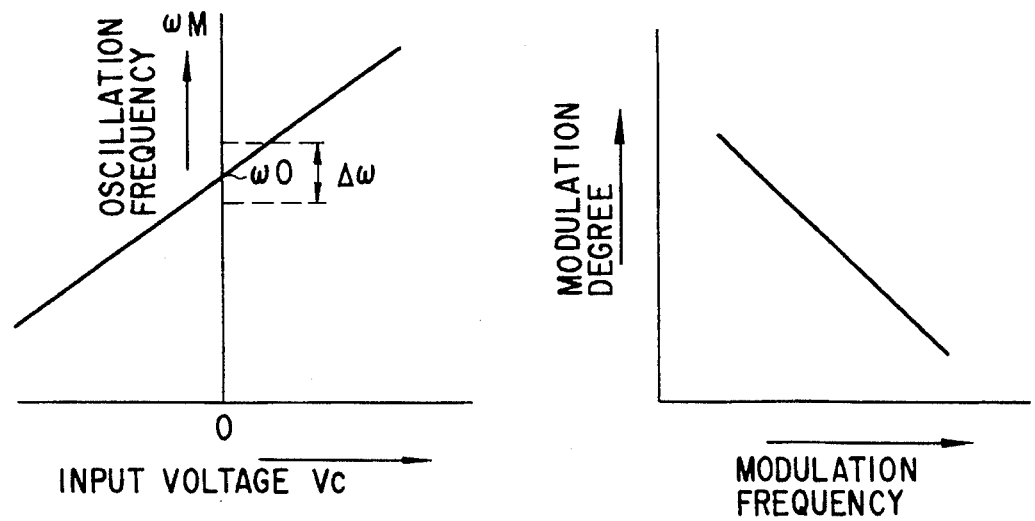
FIG. 3
FIG. 6
(PRIOR ART)
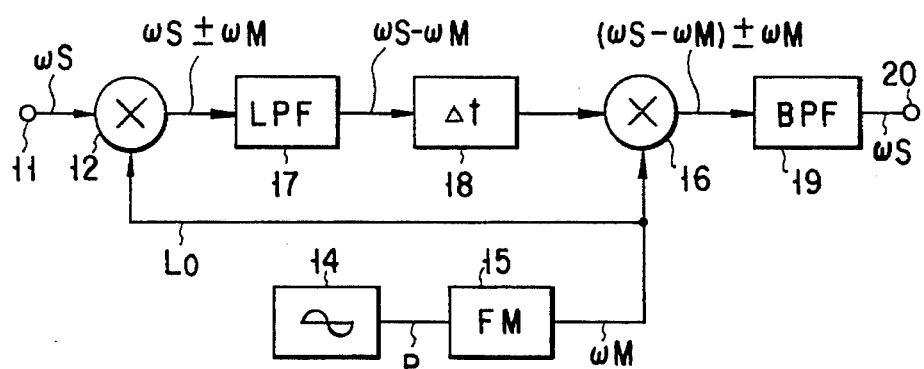
FIG. 4
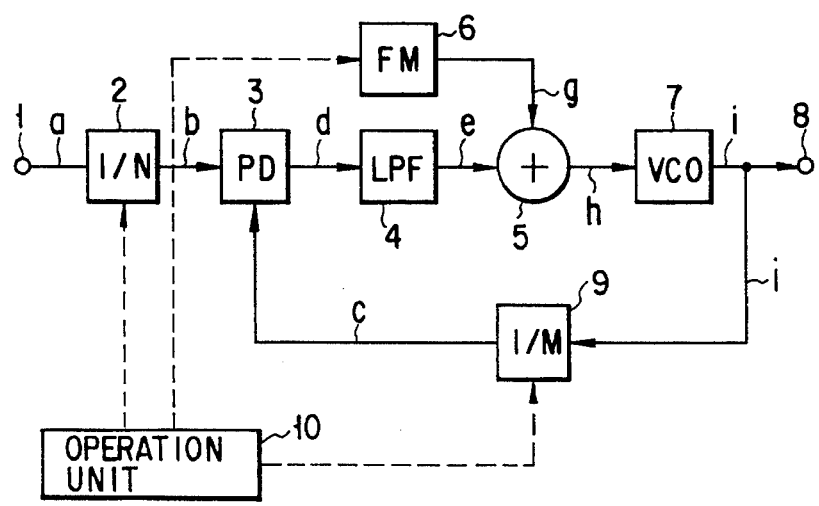
FIG. 5
(PRIOR ART)

PHASE MODULATOR CAPABLE OF INDIVIDUALLY DEFINING MODULATION DEGREE AND MODULATION FREQUENCY

BACKGROUND OF THE INVENTION

1. Field of the Invention

The present invention generally relates to a phase modulator and, more particularly, a phase modulator capable of being used as, e.g., a jitter modulator or generator for the jitter tolerance testing of a digital communication system to generate a phase-modulated signal obtained by shifting the phase of a signal to be modulated in accordance with the amplitude and frequency of a modulating signal.

2. Description of the Related Art

In recent years, the importance of digital communication systems have been increasing as an infrastructure for supporting an information-oriented society for a future generation.

The ITU-T (predecessor: CCITT) recommends a new synchronous network interface called an SDH (Synchronous Digital Hierarchy) as a basic network for digital communication systems.

Apparatuses to be incorporated in such an SDH system are being developed and put into practical use by PTTs and communication equipment manufacturers in the world.

One of the important factors in measurements of SDH apparatuses and systems is jitter defined as an instantaneous fluctuation in which the phase of a signal is advanced/ delayed with respect to an ideal time position due to crosstalk or reflection of digital lines.

To manage jitter contained in an SDH system, the ITU-T[2]) defines that the input jitter tolerance of an apparatus to be measured must exceed a predetermined jitter mask for each bit rate as one of the jitter requirement specifications in the bit rates up to STM-16 (2488.32 Mb/s).

One of the test items in testing performance of each type of communication equipment incorporated in a communication network is a jitter tolerance testing.

In general, signals to be input to a variety of communication equipments are often transmitted through, e.g., long-distance optical fiber cables, microwave lines, and satellite communication channels.

These signals may often be transmitted through a large number of repeaters or measuring instruments.

A phenomenon in which the phases of the signals are offset due to the above causes in the communication lines or channels is called "jitter". The jitter tolerance testing is to measure a maximum degree of phase offset with which each communication equipment can accurately receive a signal.

A signal jitter-modulated with a sinusoidal wave is used in this measurement which is performed together with a code error measurement.

More specifically, at an arbitrary sinusoidal jitter modulation frequency, a jitter amount is gradually increased, and a value obtained immediately before occurrence of an error is defined as an input jitter tolerance.

To measure jitter tolerance characteristics of each communication equipment, a phase-modulated signal having an arbitrary modulation degree and an arbitrary modulation frequency must be generated and applied to a target communication equipment.

An arrangement using a phase-locked loop (PLL) circuit as a Jitter modulator or generator, i.e., a phase modulator for generating this phase-modulated signal, is proposed in, e.g., U.S. Pat. No. 4,810,977.

The phase modulator using this PLL circuit has an arrangement, as shown in FIG. 5.

An input signal a (=$\sin \omega_s t$) of a predetermined carrier angular frequency $\omega_S$ input from an input terminal 1 is frequency-divided into an 1/N signal by a frequency divider 2.

An input signal b ($\sin \omega_S t/N$) whose frequency is 1/N-divided by the frequency divider 2 is input to a phase comparator (PD) 3 connected to the output of the frequency divider 2.

The phase comparator 3 detects a phase difference $\Delta\theta$ between the input signal b whose frequency is 1/N-divided by the frequency divider 2 and a frequency-divided signal c output from another frequency divider 9.

The high-frequency component of a phase difference signal d (=$\Delta\theta$) output from the phase comparator 3 is removed by a low-pass filter (LPF) 4, and an output signal from the low-pass filter 4 is input to one input terminal of an adder 5.

An FM signal g represented by equation (1) is input from a frequency-demodulated (FM) signal generator 6 to the other input terminal of the adder 5.

$$g = \sin \omega_M t = \sin(\omega_0 t - m_f \cos pt) \quad (1)$$

$\omega_0$: the reference angular frequency
p: the modulating angular frequency
$m_f$: the modulation index The adder 5 adds the phase difference signal e and the FM signal g and outputs a sum signal h to a voltage-controlled oscillator (VCO) 7 connected to the output of the adder 5.

$$h = e + g = \Delta\theta + \sin(\omega_0 t - m_f \cos pt) \quad (2)$$

The VCO 7 outputs an output signal i having a frequency changing in proportion to the signal level of the sum signal h.

The output signal i from the VCO 7 is externally output from an output terminal 8 of the phase modulator and applied to the frequency divider 9.

The frequency divider 9 frequency-divides the output signal i from the VCO 7 into a 1/M signal, and this signal is output as a frequency-divided signal c to the phase comparator 3.

The frequency division ratio 1/M of the frequency divider 9 is set to match the frequency of the frequency-divided signal c input to the phase comparator 3 with the frequency of the input signal b.

The frequency division ratios 1/N and 1/M of the frequency dividers 2 and 9 can be manually changed by an operator at an operation unit 10.

A closed loop comprising the phase comparator 3, the LPF 4, the adder 5, the VCO 7, and the frequency divider 9 constitutes a kind of phase-locked loop (PLL) circuit.

In the phase modulator incorporating this PLL circuit, the input signal a input from the input terminal 1 of the phase modulator is frequency-divided into an 1/N signal by the frequency divider 2, and this frequency-divided signal is input to the PLL circuit.

In this PLL circuit, the sum signal h input to the VCO 7 has a waveform on which the phase difference signal e is superposed.

A phase θ of the 1/N input signal b changes in accordance with a change in instantaneous value of the FM signal g input through the adder 5.

The final change appears as a change in phase of the output signal i from the VCO 7.

The output signal i appearing at the output terminal 8 is a phase-modulated signal whose phase θ changes in accordance with a change in instantaneous value of the FM signal g.

The phase modulation characteristics of this phase-modulated signal are a modulation frequency representing a rate of change in phase in phase modulation and a modulation degree representing a phase change range, e.g., a time width in phase modulation.

In this case, the modulation frequency corresponds to the rate of change in instantaneous value of the FM signal g, i.e., the modulating angular frequency p of the FM signal g. For this reason, to change the modulation frequency, the modulating angular frequency p of the FM signal g is changed.

The modulation degree corresponds to the change width of the instantaneous value of the FM signal g, i.e., the amplitude thereof.

To change the modulation degree, the amplitude of the FM signal g is changed.

When the amplitude of the FM signal g is increased to increase the modulation degree, an output from the adder 5 is undesirably saturated.

The phase comparator 3 generally detects only the phase difference Δθ in the phase range of 200° to 300°.

The frequency divider 2 is inserted in the input stage of the PLL circuit to reduce the frequency of the input signal b input to the phase comparator 3 in the PLL circuit.

With this arrangement, a larger time width, i.e., a larger modulation degree can be obtained than a case wherein the amplitude of the FM signal g is changed to obtain an identical phase difference Δθ.

To change the modulation degree of the phase-modulated signal (output signal i), the amplitude of the FM signal g is not changed, but the frequency division ratio 1/N of the frequency divider 2 is generally changed.

The modulation frequency and modulation degree of the phase-modulated signal (output signal i) from the phase modulator shown in FIG. 5 can be changed to arbitrary values.

The phase modulator using the PLL circuit shown in FIG. 5, however, still has the following problem left unsolved in practice.

More specifically, when the frequency division ratio 1/N of the frequency divider 2 is increased to increase the modulation degree in phase modulation, the frequency of the input signal b input to the PLL circuit is reduced.

When the frequency is reduced, the cutoff frequency of the LPF 4 incorporated in the PLL circuit must be decreased accordingly.

As a result, the frequency response characteristics of the entire PLL circuit are degraded to reduce the loop gain.

In this state, even if the modulating angular frequency p of the FM signal g is increased to increase the modulation frequency in phase modulation, this change is absorbed in the PLL circuit and does not appear in the output signal i.

To increase the modulation frequency, the modulating angular frequency p of the FM signal g must be increased, and at the same time, the frequency division ratio 1/N of the frequency divider 2 is set low, thereby increasing the cutoff frequency of the LPF 4.

When the frequency division ratio 1/N of the frequency divider 2 is set low, the modulation degree in phase modulation cannot be set large.

In this manner, in the phase modulator using the PLL circuit, the modulation degree in phase modulation for the output phase-modulated signal is closely related to the modulation frequency. It is very difficult to set the other factor to an arbitrary value while fixing one factor. Therefore, both the factors cannot be simultaneously set at large values.

FIG. 6 is a graph showing the relationship between the set modulation degree and the set modulation frequency in the phase modulator shown in FIG. 5.

As can be apparent from FIG. 6, for example, when the modulation degree is set large, the modulation frequency cannot be set high. To the contrary, when the modulation frequency is set high, the modulation degree becomes small.

As a result, the conventional phase modulator using the FM modulator constituted by the PLL circuit, as shown in FIG. 5, has limitations for generating a phase-modulated signal having an arbitrary modulation degree and frequency which are required to measure the jitter tolerance characteristics of each communication equipment described above.

SUMMARY OF THE INVENTION

It is, therefore, an object of the present invention to provide a new and improved phase modulator in which a delay means for obtaining a modulation degree is employed to obtain a large modulation degree and a high modulation frequency in phase modulation for a phase-modulated signal, and the modulation degree and frequency can be independently controlled, and therefore a phase-modulated signal having an arbitrary modulation degree and an arbitrary frequency can be output in a wide phase change range and a wide modulation frequency range without using a frequency divider and a PLL circuit which are used in a conventional phase modulator.

According to an aspect of the present invention, there is provided a phase modulator comprising:

FM signal generating means for generating an FM signal obtained by frequency-modulating a reference frequency signal with a modulating frequency signal in order to set a modulation degree and a modulation frequency in phase modulation;

first frequency conversion means for mixing an input signal having a predetermined carrier frequency with the FM signal from the FM signal generating means;

first signal extracting means for extracting one of upper and lower sideband signals obtained from the first frequency conversion means as an intermediate frequency signal;

delay means for delaying the intermediate frequency signal from the first signal extracting means by a predetermined time in order to set the modulation degree in the phase modulator;

second frequency conversion means for mixing the intermediate frequency signal delayed by the delay means with the FM signal from the FM signal generating means; and second signal extracting means for extracting a frequency signal corresponding to the carrier frequency component of upper and lower sideband signals obtained from the second frequency conversion means.

According to another aspect of the present invention, there is provided a phase modulator comprising:

FM signal generating means for generating an FM signal obtained by frequency-modulating a reference frequency signal with a modulating frequency signal in order to variably set a modulation degree and a modulation frequency in phase modulation;

first frequency conversion means for mixing an input signal having a predetermined carrier frequency with the FM signal from the FM signal generating means;

first signal extracting means for extracting one of upper and lower sideband signals obtained from the first frequency conversion means as an intermediate frequency signal;

delay means for delaying the intermediate frequency signal from the first signal extracting means by a predetermined time in order to variably set the modulation degree in the phase modulator;

second frequency conversion means for mixing the intermediate frequency signal delayed by the delay means with the FM signal from the FM signal generating means; and second signal extracting means for extracting a frequency signal corresponding to the carrier frequency component of upper and lower sideband signals obtained from the second frequency conversion means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a circuit diagram showing the detailed arrangement of an FM modulation circuit of this embodiment;

FIG. 3 is a graph showing the relationship between the oscillation frequency and the input voltage in the FM modulation circuit of this embodiment;

FIG. 4 is a block diagram for explaining the mutual relationship between the frequencies (carrier frequencies) of output signals from the respective parts in this embodiment;

FIG. 5 is a block diagram showing the schematic arrangement of a conventional phase modulator; and FIG. 6 is a graph showing the relationship between the modulation degree and the modulation frequency of a phase-modulated signal from the conventional phase modulator.

DETAILED DESCRIPTION OF THE PREFERRED EMBODIMENTS

Figure 1:
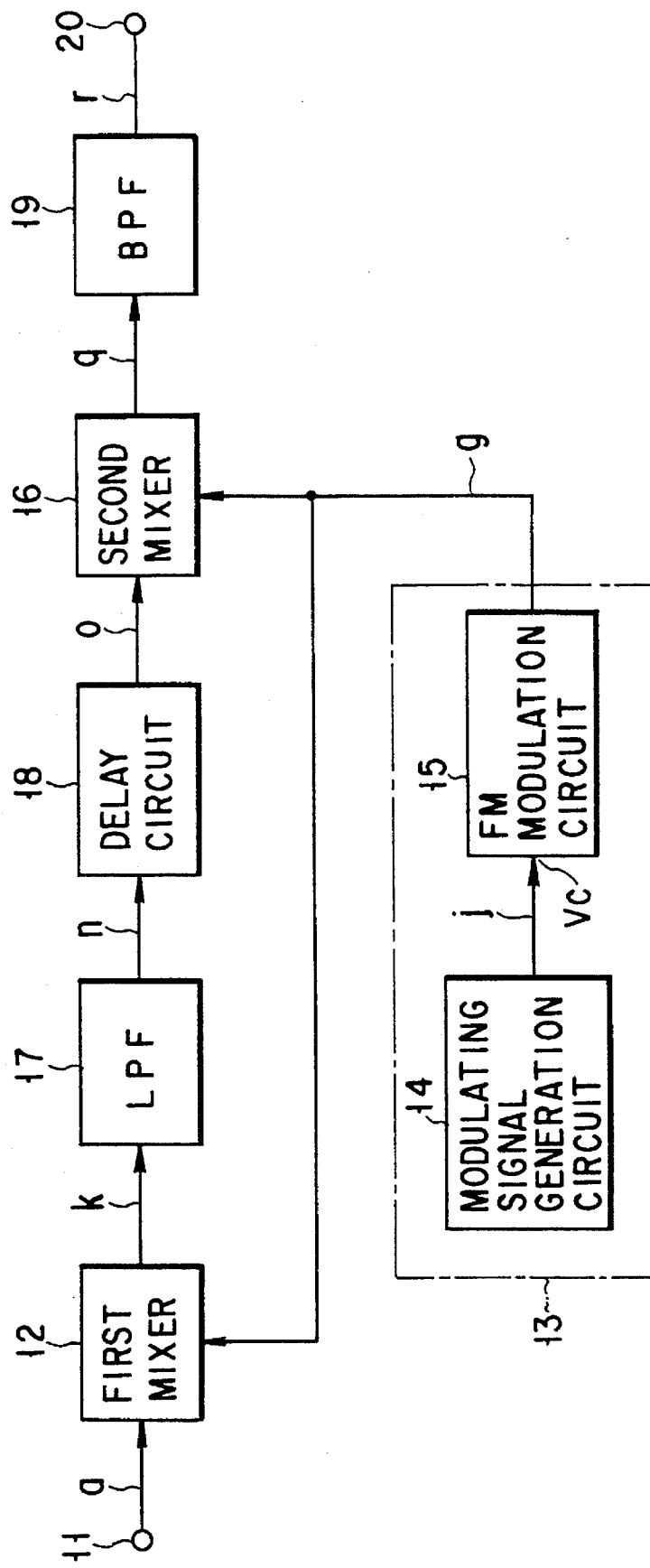
FIG. 1 is a block diagram showing the schematic arrangement of a phase modulator according to an embodiment of the present invention.

Reference will now be made in detail to the presently preferred embodiments of the invention as illustrated in the accompanying drawings, in which like reference characters designate like or corresponding parts throughout the several drawings.

The present invention will be generally described below.

In order to achieve the above object, a phase modulator according to the present invention comprises an FM signal generating means for generating an FM signal obtained by frequency-modulating a reference frequency signal with a modulating frequency signal, a first frequency conversion means for mixing the FM signal from the FM signal generating means with an input signal having a predetermined carrier frequency to output a pair of frequency signals representing the sum and difference thereof, a first signal extracting means for extracting one of the pair of frequency signals from the first frequency conversion means as an intermediate frequency signal, a delay means for delaying the intermediate frequency signal from the first signal extracting means by a predetermined time to set a modulation degree in phase modulation, a second frequency conversion means for mixing the intermediate frequency signal delayed by the delay means with the FM signal from the FM signal generating means to output a pair of frequency signals representing the sum and difference thereof, and a second signal extracting means for extracting a frequency signal corresponding to the carrier frequency component from the pair of frequency signals from the second frequency conversion means as a phase-modulated signal.

In the phase modulator having the above arrangement, the FM signal output from the FM signal generating means and the input signal are mixed by the first frequency conversion means to obtain the pair of intermediate frequency signals having a difference between a carrier angular frequency $\omega_S$ and an angular frequency $\omega_M$ determined as a function between a reference angular frequency $\omega_0$ and a modulating angular frequency p of the FM signal.

One of the pair of intermediate frequency signals is delayed by a predetermined time $\Delta t$ by the delay means.

The delayed intermediate frequency signal and the FM signal are mixed again by the second frequency conversion means.

The pair of difference frequency signals mixed again contain a delay time $\Delta t$, the reference angular frequency $\omega_0$, the modulating angular frequency p, and the carrier angular frequency $\omega_S$. For this reason, of the pair of difference frequency signals, a sideband which does not contain the reference angular frequency $\omega_0$ but contains the carrier angular frequency $\omega_S$ is selected by the second signal extracting means, thereby obtaining the phase-modulated signal.

In the phase modulator having the above arrangement, the modulation degree in phase modulation for the phase-modulated signal and the modulation frequency can be arbitrarily and independently set by the delay means and the FM-modulated signal generating means, respectively.

The present invention will be described with reference to the preferred embodiments in conjunction with the accompanying drawings.

FIG. 1 is a block diagram showing the schematic arrangement of a phase modulator according to an embodiment.

An input signal a input from an input terminal 11, having a predetermined carrier angular frequency $\omega_S$, and represented by equation (3) is input to a first mixer 12:

$$a = \sin \omega_S t \qquad (3)$$

In addition to the input signal a, the first mixer 12 also receives an FM signal g output from an FM signal generation circuit 13.

This FM signal generation circuit 13 is constituted by a modulating signal generation circuit 14 and an FM modulation circuit 15.

In this case, the modulating signal generation circuit 14 comprises an oscillator for generating a modulating frequency signal j represented by equation (4) below:

$j = \sin pt$ (P: modulating angular frequency)  (4)

This modulating frequency signal j is input to the control voltage terminal of the FM modulation circuit 15.

The FM modulation circuit 15 comprises, e.g., a voltage-controlled oscillator (VCO) shown in FIG. 2. An oscillation angular frequency $\omega_M$ changes in proportion to a voltage Vc applied to the control voltage terminal.

More specifically, as shown in FIG. 3, the oscillation angular frequency $\omega_M$ changes centered on the reference angular frequency $\omega_0$ in accordance with the amplitude value of the modulating frequency signal j.

A change width $\Delta\omega$ of this oscillation angular frequency $\omega_M$ is determined in correspondence with the amplitude of the modulating frequency signal j.

More specifically, the FM modulation circuit 15 frequency-modulates (FM) the reference frequency signal of the reference angular frequency $\omega_0$ with the modulating frequency signal j.

As a result, the FM modulation circuit 15 outputs an FM signal g represented by equation (5):

$$g = \sin \omega_M t = \sin(\omega_0 t - m_f \cos pt) \quad (5)$$

$\omega_0$: the reference angular frequency
p: the modulating angular frequency
$m_f$: the modulation index Equation (5) is identical to equation (1) defined previously.

A VCO 150 as the FM modulation circuit 15 shown in FIG. 2 comprises a current control multivibrator 151, an LPF 152, a coupling unit 153, a temperature compensation unit 154, a voltage compensation unit 155, a frequency adjustment unit 156, and an amplification unit 157.

The VCO 150 oscillates an FM signal having a predetermined frequency width centered on 933.12 MHz ($\approx$622 MHz$\times$1.5) generated by the current control multivibrator 151 under the control of the frequency adjustment unit 156, on the basis of a DC modulating signal voltage Vc of up to 50 MHz applied from the modulating signal generation circuit 14 such as a frequency synthesizer (not shown) to the input terminal (voltage control terminal) of the high-frequency removal LPF 152. The generated FM signal is output as a VCO output through the amplification unit 157.

In this case, a 20-mA constant current flows in one side of the coupling unit 153 using the voltage compensation function of the voltage compensation unit 155 and the temperature compensation function of the temperature compensation unit 154 when a semi-rigid cable 151a of the current control multivibrator 151 has a predetermined cable length (5 mm). More specifically, when a current of, e.g., 10 mA is flowed by the input modulating signal voltage Vc, a current from the current control multivibrator 151 is reduced.

The current control multivibrator 151 oscillates an FM signal having a frequency corresponding to a change in current thereof.

The other side of the coupling unit 153 has a canceling function of setting the input DC voltage to 0 V.

The FM signal g output from the FM signal generation circuit 13 is input to one input terminal of each of the first mixer 12 and a second mixer 16.

In this case, the first mixer 12 mixes the input signal a and the FM signal g and outputs a signal k containing a pair of difference frequency signals having angular frequency differences ($\omega_S \pm \omega_M$) representing the sum and difference between the signals a and g represented by equation (6).

$$\begin{aligned}k &= a \times g = (\sin\omega_S t) \cdot \sin(\omega_0 t - m_f \cos pt) \quad (6)\\ &= K_1\{\cos(\omega_S t - \omega_0 t + m_f \cos pt) - \\ &\quad \cos(\omega_S t + \omega_0 t - m_f \cos pt)\}\end{aligned}$$

$k_1$: the constant

The output signal k from the first mixer 12 is input to a low-pass filter (LPF) 17 serving as the first signal extracting means connected to the output of the first mixer 12.

The LPF 17 extracts and outputs an intermediate frequency signal n (equation (7)) corresponding to a lower angular frequency ($\omega_S - \omega_M$) of the pair of difference frequency signals (upper and lower sideband signals) contained in the output signal k from the first mixer 12:

$$\begin{aligned}n &= K_1\{\cos(\omega_S t - \omega_0 t + m_f \cos pt)\} \quad (7)\\ &= K_1[\cos\{(\omega_S - \omega_0)t + m_f \cos pt\}]\end{aligned}$$

The intermediate frequency signal n output from the LPF 17 is input to a delay circuit 18 connected to the output of the LPF 17.

The delay circuit 18 is constituted by a signal line having a length set in correspondence with the designated delay time $\Delta t$. The input intermediate frequency signal n is delayed by the time $\Delta t$ required to pass the signal n through this signal line, thus outputting the delayed signal.

An intermediate frequency signal o output from the delay circuit 18 is delayed by the time $\Delta t$ with respect to the intermediate frequency signal n from the LPF 17, as indicated by equation (8) below:

$$\begin{aligned}o &= K_1[\cos\{(\omega_S - \omega_0)(t - t\Delta) + m_f\cos p(t - \Delta t)\}] \quad (8)\\ &= K_1[\cos\{(\omega_S - \omega_0)t - (\omega_S - \omega_0)\Delta t + \\ &\quad m_f\cos p(t - \Delta t)\}]\end{aligned}$$

The intermediate frequency signal o delayed by the time $\Delta t$ by the delay circuit 18 is input to the second mixer 16 connected to the output of the delay circuit 18.

The second mixer 16 mixes the FM signal g from the FM signal generation circuit 13 with the intermediate frequency signal o from the delay circuit 18 to output a signal q containing a pair of difference frequency signals (upper and lower sideband signals) corresponding to angular frequency differences $\{(\omega_S - \omega_M) \pm \omega_M\}$ representing the sum and difference between the signals g and o represented by equation (9) below:

$$\begin{aligned}q &= g \times o = K_1\{\sin(\omega_0 t - m_f\cos pt)\} \times \quad (9)\\ &\quad [\cos\{(\omega_S - \omega_0)t - (\omega_S - \omega_0)\Delta t + \\ &\quad m_f\cos p(t - \Delta t)\}]\\ &= K_2\{\sin(A + B) + \sin(A - B)\}\end{aligned}$$

where
$A = \omega_0 t - m_f\cos pt$
$B = (\omega_S - \omega_0)(t - \Delta t) + m_f\cos p(t - \Delta t)$
$K_2$: the constant Equation (9) is rearranged to obtain equation (10) below:

$$q = K_2[\sin\{\omega_S t - m_f\cos pt + m_f\cos p(t - \Delta t) + (\omega_0 - \omega_S)\Delta t\}] + K_2\sin(A - B) \quad (10)$$

The output signal q from the second mixer 16 is input to a bandpass filter (BPF) 19 serving as a second signal extracting means connected to the output of the second mixer 16.

The bandpass frequency range of the BPF 19 is the range of $\pm p$ centered on the carrier angular frequency $\omega_S$ so as to pass only the term corresponding to $K_2\sin(A+B)$ (equation (9)) representing one difference frequency signal containing the carrier angular frequency $\omega_S$ of the input signal a.

The term corresponding to the $K_2\sin(A-B)$ (equation (9)) representing the other difference frequency signal contained in the output signal q from the second mixer 16 is eliminated, so that an output signal r from the BPF 19 is defined by equation (11) below:

$$r = K_2 [\sin\{\omega_S t - m_f \cos pt + m_f \cos p(t-\Delta t) + (\omega_0 - \omega_S)\Delta t\}] \quad (11)$$

FIG. 4 is a block diagram illustrating the mutual relationship between the frequencies of the output signals from the respective circuits constituting the phase modulator shown in FIG. 1.

More specifically, as can be apparent from FIG. 4, one angular frequency component containing only the carrier angular frequency component $\omega_S$ of the input signal, in which the angular frequency component $\omega_M$ of the FM signal g is canceled from the pair of angular frequency components $\{(\omega_S-\omega_M)+\omega_M=\omega_S\}$ and $\{(\omega_S-\omega_M)-\omega_M=\omega_S-2\omega_M\}$ contained in the output signal q from the second mixer 16 is selected by the BPF 19 serving as the second signal extracting means.

In addition, $\{m_f\cos p(t-\Delta t) - m_f\cos pt\}$ in equation (11) can be modified as follows:

$$\begin{aligned}
m_f\cos p(t-\Delta t) - m_f\cos pt &= m_f[\cos\{p(t-\Delta t/2) - p(\Delta t/2)\} - \\
&\quad \cos\{p(t-\Delta t/2) + p(\Delta t/2)\}] \\
&= 2m_f\{\sin p(t-\Delta t/2) \cdot \sin p(\Delta t/2)\}
\end{aligned}$$

therefore, equation (11) can be modified into equation (12):

$$\begin{aligned}
r &= K_2[\sin\{\omega_S t + 2m_f\sin p(t-\Delta t/2) \cdot \\
&\quad \sin p(\Delta t/2) + (\omega_0 - \omega_S)\Delta t\}] \\
&= K_2[\sin\{\omega_S t + 2m_f\sin p(\Delta t/2) \cdot \\
&\quad \sin p(t-\Delta t/2) + (\omega_0 - \omega_S)\Delta t\}]
\end{aligned} \quad (12)$$

In this case, since $p(\Delta t/2) \ll 1$ is established, a substitution of $p(\Delta t/2)$ into $\sin p(\Delta t/2)$ yields equation (13) below:

$$r = K_2[\sin\{\omega_S t + 2m_f p(\Delta t/2)\cdot\sin p(t-\Delta t/2) + (\omega_0-\omega_S)\Delta t\}] \quad (13)$$

As described above, as the modulation index $m_f$ is defined as $\Delta\omega/p$, an output signal r from an output terminal 20 of the phase modulator is finally represented by equation (14) below:

$$r = K_2[\sin\{\omega_S t + \Delta\omega\cdot\Delta t\cdot\sin p(t-\Delta t/2) + (\omega_0-\omega_S)\Delta t\}] \quad (14)$$

The feature of the arrangement of the above embodiment can be summarized as follows. The FM component ($m_f\cos pt$) output from the first mixer 12 is delayed to obtain $\{m_f\cos p)(t-\Delta t)\}$, and the second mixer 16 calculates a difference between the above result and the non-delayed FM component ($m_f\cos pt$) to differentiate the FM component ($m_f\cos pt$).

The output signal r represented by equation (14) becomes a phase-modulated signal in which the phase θ of the carrier angular frequency $\omega_S$ of the input signal a applied to the input terminal 11 is changed by the angular frequency range $\Delta\omega$ of the FM modulation circuit 15 and the delay time $\Delta t$ of the delay circuit 18, and the modulating angular frequency p.

The change range of the phase θ, i.e., the modulation degree in phase modulation for the phase-modulated signal (output signal r) can be set to an arbitrary value by changing the delay time $\Delta t$ of the delay circuit 18 and the angular frequency range $\Delta\omega$ (FIG. 3) of the FM modulation circuit 15.

In addition, the modulation frequency representing the rate of modulation in phase modulation can be set to an arbitrary value by changing the modulating angular frequency p of the modulating frequency signal j.

In this phase modulator, the fist mixer 12, the LPF 17, the delay circuit 18, the second mixer 16, and the BPF 19 are connected in series with each other, and parameters and constants set in the respective portions independently influence the characteristics of the phase-modulated output signal (output signal r).

More specifically, unlike the conventional phase modulation constituting a closed loop using the PLL circuit shown in FIG. 5, the phase modulator of this embodiment does not cause the modulation degree and the modulation frequency to influence each other.

In the phase modulator of this embodiment, the phase comparator 3 used in the conventional phase modulator shown in FIG. 5 is not used. Even if a high carrier angular frequency $\omega_S$ is input to the input terminal 11, an arbitrary delay time $\Delta t$ can be set in the delay circuit, and any frequency divider need not be inserted.

As a result, in the phase modulator of this embodiment, the cutoff frequency of the LPF 17 need not be reduced, and excellent frequency response characteristics of the phase modulator can be maintained as a whole.

When the delay time $\Delta t$ of the delay circuit 18 is changed in the phase modulator of the present invention, the modulation degree in phase modulation for the output phase-modulated signal can be arbitrarily set in a wide range without using any frequency divider.

Since the phase modulator maintains excellent frequency response characteristics regardless of the value of the modulation degree, the modulation frequency of the phase-modulated output signal can be arbitrarily set in a wide range independently of the modulation degree by changing the modulating frequency p of the modulating frequency signal j.

The phase modulator of the present invention is incorporated as a jitter generator in a jitter tolerance testing apparatus for measuring jitter tolerance characteristics representing a maximum degree of jitter with which each communication apparatus incorporated in a communication network can accurately receive a signal, thereby accurately and easily measuring the jitter tolerance.

For example, in the phase modulator of the embodiment having the input signal frequency of 622 MHz, the maximum upper limit frequency of the modulation frequency of the phase-modulated signal can be assured to 20 MHz or more.

When the maximum upper limit frequency of the modulation frequency is, e.g., 20 MHz, a signal line having length about 10 m is employed as the delay circuit 18 to realize a modulation degree of one period (2 π).

The present invention is not limited to the particular embodiment described above.

The LPF 17 for extracting the intermediate frequency signal n (equation (7)) corresponding to the lower angular frequency $(\omega_S-\omega_M)$ is used as the first signal extracting means for extracting one intermediate frequency signal from the output signal k consisting of the pair of intermediate frequency signals output from the first mixer 12. However, an HPF (High-Pass Filter) for extracting an intermediate frequency signal corresponding to the higher angular frequency $(\omega_S+\omega_M)$ may be used.

In this case, the BPF 19 serving as the second signal extracting means has a pass frequency range to select a difference frequency signal opposite to that of the above embodiment.

In the above embodiment, a signal line is used as the delay circuit 18 for generating the delay time $\Delta t$. However, a delay circuit equivalent to the signal line, which is constituted by a coil or capacitor may be used.

When a voltage-controlled variable capacitance element is used as a capacitor for this equivalent delay circuit, a phase modulation degree can be electronically set variable.

In the phase modulator of the present invention, as has been described above, the frequency conversion means for mixing the FM signal with the input signal and the delay means for obtaining the delay time are not constituted as a loop circuit but is constituted by a series-connected open circuit.

In addition, in the phase modulator of the present invention, the delay means is used to obtain the modulation degree.

According to the present invention, therefore, there is provided a phase modulator in which a large modulation degree and a high modulation frequency can be obtained in phase modulator for a phase-modulated signal, the modulation degree and the modulation frequency can be independently controlled, and a phase-modulated signal having an arbitrary modulation degree and an arbitrary modulation frequency can be obtained in a wide modulation range and a wide modulation frequency range.

Additional embodiments of the present invention will be apparent to those skilled in the art from consideration of the specification and practice of the present invention disclosed therein. It is intended that the specification and examples be considered as exemplary only, with the true scope of the present invention being indicated by the following claims.

What is claimed is:

1. A phase modulator comprising:

FM signal generating means for generating an FM signal obtained by frequency-modulating a reference frequency signal with a modulating frequency signal in order to set a modulation degree and a modulation frequency in phase modulation;

first frequency conversion means for mixing an input signal having a predetermined carrier frequency with the FM signal from said FM signal generating means;

first signal extracting means for extracting one of upper and lower sideband signals obtained from said first frequency conversion means as an intermediate frequency signal;

delay means for delaying the intermediate frequency signal from said first signal extracting means by a predetermined time in order to set the modulation degree in said phase modulator;

second frequency conversion means for mixing the intermediate frequency signal delayed by said delay means with the FM signal from said FM signal generating means; and second signal extracting means for extracting a frequency signal corresponding to the carrier frequency component of upper and lower sideband signals obtained from said second frequency conversion means.

2. A modulator according to claim 1, wherein said FM signal generating means comprises:

a modulating signal generation circuit for generating a modulating frequency signal; and an FM modulation circuit for frequency-modulating the modulating frequency signal from said modulating signal generation circuit with the reference frequency signal.

3. A modulator according to claim 2, wherein said FM modulation circuit comprises a voltage-controlled oscillator in which an oscillation frequency is changed centered on a predetermined reference frequency in accordance with an amplitude value of the modulating frequency signal.

4. A modulator according to claim 3, wherein said voltage-controlled oscillator includes a current control multivibrator whose oscillation frequency is changed in accordance with the amplitude value of the modulating frequency signal.

5. A modulator according to claim 1, wherein said first signal extracting means includes a low-pass filter for filtering a lower sideband signal of the upper and lower sideband signals.

6. A modulator according to claim 1, wherein said delay means includes a signal line having a length corresponding to the predetermined time.

7. A modulator according to claim 1, wherein said second signal extracting means includes a bandpass filter having predetermined pass band characteristics.

8. A phase modulator comprising:

FM signal generating means for generating an FM signal obtained by frequency-modulating a reference frequency signal with a modulating frequency signal in order to variably set a modulation degree and a modulation frequency in phase modulation;

first frequency conversion means for mixing an input signal having a predetermined carrier frequency with the FM signal from said FM signal generating means;

first signal extracting means for extracting one of upper and lower sideband signals obtained from said first frequency conversion means as an intermediate frequency signal;

delay means for delaying the intermediate frequency signal from said first signal extracting means by a predetermined time in order to variably set the modulation degree in said phase modulator;

second frequency conversion means for mixing the intermediate frequency signal delayed by said delay means with the FM signal from said FM signal generating means; and second signal extracting means for extracting a frequency signal corresponding to the carrier frequency component of upper and lower sideband signals obtained from said second frequency conversion means.

9. A modulator according to claim 8, wherein said FM signal generating means comprises:

a modulating signal generation circuit for generating a modulating frequency signal; and an FM modulation circuit for frequency-modulating the modulating frequency signal from said modulating signal generation circuit with the reference frequency signal.

10. A modulator according to claim 9, wherein said FM modulation circuit comprises a voltage-controlled oscillator in which an oscillation frequency is changed centered on a predetermined reference frequency in accordance with an amplitude value of the modulating frequency signal.

11. A modulator according to claim 10, wherein said voltage-controlled oscillator includes a current control multivibrator whose oscillation frequency is changed in accordance with the amplitude value of the modulating frequency signal.

12. A modulator according to claim 8, wherein said first signal extracting means includes a low-pass filter for filtering a lower sideband signal of the upper and lower sideband signals.

13. A modulator according to claim 8, wherein said delay means includes a signal line having a length corresponding to the predetermined time.

14. A modulator according to claim 8, wherein said second signal extracting means includes a bandpass filter having predetermined pass band characteristics.

* * * * *